United States Patent
Jeong (10) Patent No.: US 7,651,936 B2
(45) Date of Patent: Jan. 26, 2010

(54) METHOD FOR PATTERNING A SEMICONDUCTOR DEVICE

(75) Inventor: Eun-Soo Jeong, Chungoheongbuk-do (KR)

(73) Assignee: Dongbu HiTek Co., Ltd., Seoul (KR)

( * ) Notice: Subject to any disclaimer, the term of this patent is extended or adjusted under 35 U.S.C. 154(b) by 0 days.

(21) Appl. No.: 11/945,091

(22) Filed: Nov. 26, 2007

(65) Prior Publication Data
US 2008/0153287 A1 Jun. 26, 2008

(30) Foreign Application Priority Data
Dec. 20, 2006 (KR) ............. 10-2006-0131440

(51) Int. Cl.
*H01L 21/44* (2006.01)
(52) U.S. Cl. ............. 438/597; 438/571; 438/578; 438/579; 438/595; 257/261; 257/269; 257/314; 257/E21.66; 257/E21.678
(58) Field of Classification Search ............. 438/571, 438/578, 579, 595, 597; 257/261, 296, 300, 257/314, 326, E21.66, 645, 646, 678, 683
See application file for complete search history.

(56) References Cited

U.S. PATENT DOCUMENTS
2008/0064164 A1 * 3/2008 Dong ................. 438/257

FOREIGN PATENT DOCUMENTS
KR 1998028362 * 7/1998

* cited by examiner

*Primary Examiner*—Charles D. Garber
*Assistant Examiner*—Yasser A Abdelaziez
(74) *Attorney, Agent, or Firm*—Sherr & Vaughn, PLLC

(57) ABSTRACT

A method for patterning a semiconductor device can include forming a conductive layer over a semiconductor substrate; alternatively forming positive photoresists and negative photoresists over the conductive layer; forming a plurality of first conductive lines by selectively removing a portion of the conductive layer using the positive photoresist and the negative photoresist as masks; forming an oxide film over the semiconductor substrate including the first conductive lines and the conductive layer; performing a planarization process over the oxide film using the uppermost surface of the first conductive line as a target; removing the plurality of first conductive lines using the oxide film as a mask; forming a plurality if trenches in the semiconductor substrate and removing a portion of the oxide film to expose the uppermost surface of the conductive layer; and then forming a plurality of second conductive lines by removing the exposed conductive layer using the oxide film as a mask.

6 Claims, 10 Drawing Sheets

METHOD FOR PATTERNING A SEMICONDUCTOR DEVICE

The present application claims priority under 35 U.S.C. 119 to Korean Patent Application No. 10-2006-0131440 (filed on Dec. 20, 2006), which is hereby incorporated by reference in its entirety.

BACKGROUND

Aspects of semiconductor technology have focused on obtaining semiconductor devices having high speed and high integration. Such high speed and high integration requirements may be achieved through the fineness of a pattern roll. Light exposure may be approaching its limitation of essential resolution due to the wavelength of exposure. In light exposure using g-line (436 nm) or i-line (365 nm) as a light source, generally, the pattern role has a limitation of 0.5 μm. The degree of integration of a semiconductor device fabricating using such a pattern role corresponds to a 16 M bit DRAM. However, since mass production of large scale integration (LSI) has been achieved using this step, the development of enhanced fineness technology may be required.

Far ultraviolet lithography may be used as fine processing technology, and can implement 0.2 to 0.4 μm processing. In the case of using resist material having a low light absorption, far ultraviolet lithography can be used to form a pattern having a side wall almost substantially perpendicular to a substrate. Recently, a technology using KrF excimer laser having high brightness using far ultraviolet as a light source has been employed.

As semiconductor devices become highly integrated, methods reducing the sizes of a device isolating region and a device forming region, particularly, an active region among several methods has been proposed.

In a process for fabricating an integrated circuit, a transistor, a liquid crystal or a diode, etc., a photolithographic process for forming a fine pattern and/or an etching process for forming an electrode pattern connected thereto may be used. For example, when forming a desired pattern of a semiconductor layer on and/or over a semiconductor substrate, an insulation layer, a wiring layer, etc. may first be formed on and/or over the semiconductor substrate. After conducting a cleaning process, a photoresist suitable for the pattern may then be coated using a coating method such as a spin coat, a spray coat, a deep coat, etc. When enhanced stability and uniformity are required, a spin coat may be performed by chucking a wafer in a vacuum and rapidly rotating the wafer.

Next, a photo mask corresponding to a desired pattern may be arranged on and/or over the photoresist and ultraviolet light is irradiated thereto, thereby performing an exposure process. Thereafter, a desired resist pattern may be formed using a development process such as wetting or spraying. It may be difficult to manage temperature, density, aging, etc. using wetting, and may be relatively easy to manage such factors using spraying. An apparatus making in-line using a spray process may be used. The layer may be selectively removed using the photoresist pattern as a mask, thereby making it possible to form a desired pattern.

Figure 1A:
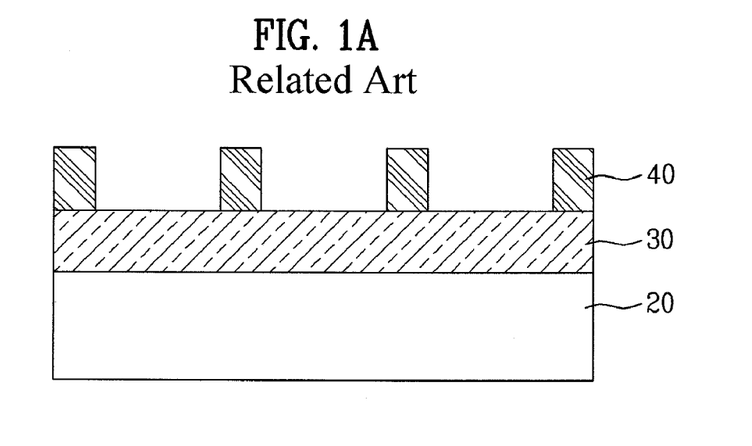
FIGS. 1A to 1C illustrate a method for patterning a semiconductor device.

As illustrated in example FIG. 1A, etch material 30 such as an isolation layer or a metal layer may be formed on and/or over semiconductor substrate 20. A plurality if photoresists 40 may be coated on and/or over etch material 30 and then selectively patterned using exposure and development processes to define a pattern forming region.

Figure 1B:
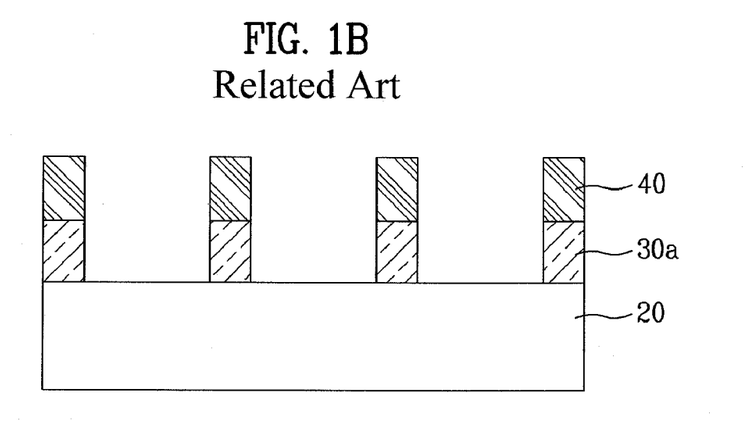

As illustrated in example FIG. 1B, the exposed etch material 30 may be selectively removed using patterned photoresist 40 as a mask to form a plurality of material patterns 30a.

Figure 1C:
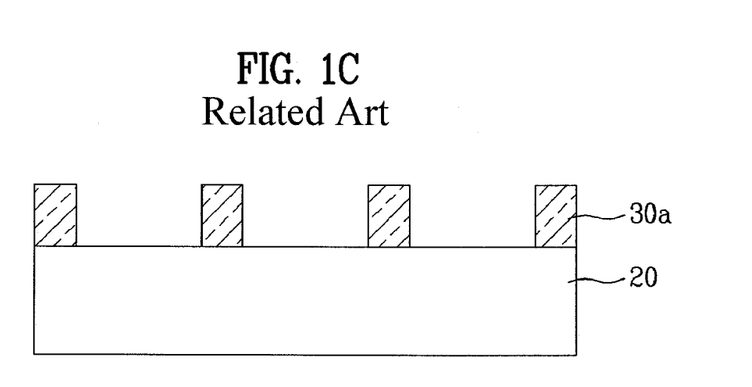

As illustrated in example FIG. 1C, photoresist 40 may then be removed, and a cleaning process may be performed with respect to semiconductor substrate 20 to remove foreign material, debris and the like generated in the etching process.

A photolithographic process using a light source such as ArF, KrF, $F_2$ and the like and the patterned photoresist has several limitations in implementing a fine pattern such as a gate. It may be difficult to implement the line width of several nm in magnitude due to the limitation of an optical system and the limitation of resolution of the photoresist polymer itself.

SUMMARY

Embodiments relate to a method for patterning a semiconductor device that can form a fine pattern having a line width of several nm in magnitude.

Embodiments relate to a method for patterning a semiconductor device that may include at least one of the following steps: forming a conductive layer over a semiconductor substrate; alternatively forming positive photoresists and negative photoresists over the conductive layer; forming a plurality of first conductive lines by selectively removing a portion of the conductive layer using the positive photoresist and the negative photoresist as masks; forming an oxide film over the semiconductor substrate including the first conductive lines and the conductive layer; performing a planarization process over the oxide film using the uppermost surface of the first conductive line as a target; removing the plurality of first conductive lines using the oxide film as a mask; forming a plurality if trenches in the semiconductor substrate and removing a portion of the oxide film to expose the uppermost surface of the conductive layer; and then forming a plurality of second conductive lines by removing the exposed conductive layer using the oxide film as a mask.

Embodiments relate to a method for patterning a semiconductor device that may include at least one of the following steps: forming an etch material layer over a semiconductor substrate; forming a plurality of positive photoresist patterns and a plurality of negative photoresist patterns over the etching material layer; forming a plurality of first etch material line patterns by selectively etching the etch material layer using the positive photoresist patterns and the negative photoresist patterns as masks; removing the positive photo resists patterns and the negative photo resists patterns; forming an oxide layer over the semiconductor substrate including the first etch material line patterns; removing the plurality of first etch material line patterns using the oxide film as a mask; removing a portion of the oxide film to expose an uppermost surface of the etch material layer; and then forming a plurality of second etch material line patterns by selectively removing a portion of the etch material layer at the exposed uppermost surface thereof using the oxide film as a mask.

Embodiments relate to a method for patterning a semiconductor device that may include at least one of the following steps: forming an etch material layer over a semiconductor substrate; alternatively forming positive photo resists and negative photo resists over the etch material layer; forming a plurality of first etch material lines by selectively removing the etch material layer using the positive photo resist and the negative photo resist as masks; forming an oxide film over the semiconductor substrate including the first etch material lines; performing a planarization process over the oxide film using the uppermost surface of the first etch material line as a target; removing the first etch material lines using the oxide film as a mask; removing a portion of the oxide film to expose an uppermost portion of the etch material layer; forming a metal layer over the etch material layer including the oxide film; and then forming a plurality of spaced apart metal lines by removing the oxide film and a portion of the metal layer provided over the uppermost surface of the oxide film.

DRAWINGS

Example

Example

DESCRIPTION

Figure 2A:
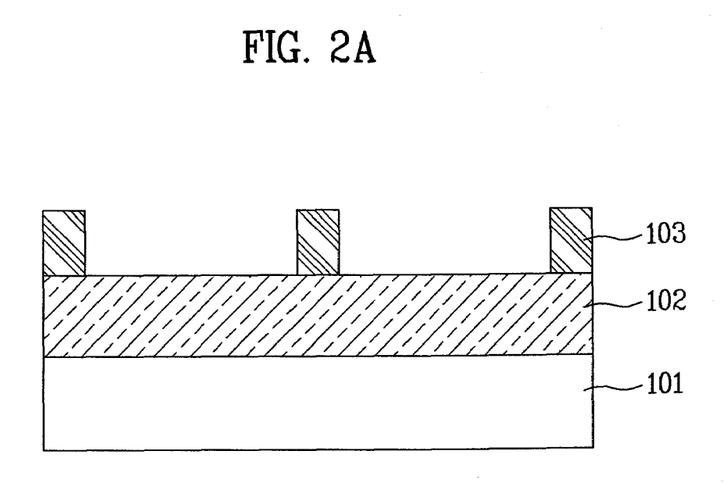
FIGS. 2 to 4 illustrate a method for patterning a semiconductor device, in accordance with embodiments.

As illustrated in example FIG. 2A, in accordance with embodiments, a method of patterning a semiconductor device can include conductive layer 102 formed on and/or over semiconductor substrate 101. Conductive layer 102 may be composed of polysilicon and may be formed using a low pressure chemical vapor deposition (LPCVD) process. The LPCVD process may be performed under the following operating conditions: a temperature of between approximately 600° C. to 615° C., time of about twenty minutes, a pressure of 0.4 Torr, and injecting $SiH_4$ gas in an amount of 2 slm. The target thickness of conductive layer 102 can be 2000±200 Å.

Thereafter, an anti-reflective layer can be formed on and/or over conductive layer 102. The anti-reflective layer can have a thickness of between approximately 250 Å to 300 Å. Positive photoresists 103 may be formed on and/or over the anti-reflective layer at a thickness of between approximately 2000 Å to 3000 Å. Positive photoresists 103 can be patterned by implementing a dense line of 100 nm or less on and/or over positive photoresist 103 utilizing ArF equipment.

Figure 2B:
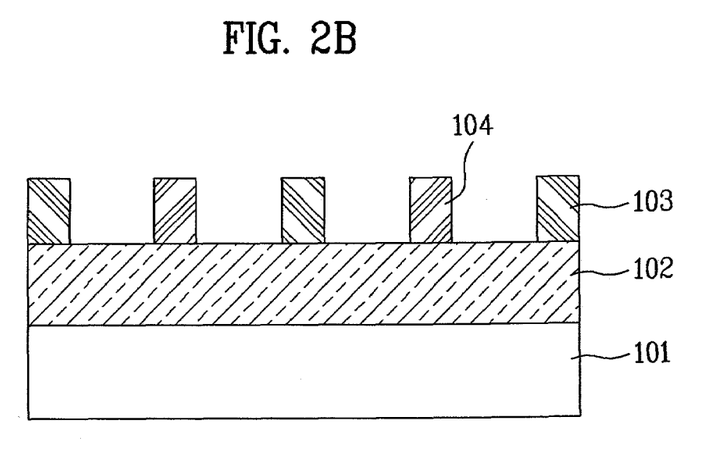

As illustrated in example FIG. 2B, negative photoresists 104 can then be formed on and/or over semiconductor substrate 101 including patterned positive photoresists 103. Negative photoresists 104 may be patterned by performing exposing and developing processes using the same mask used when exposing positive photoresists 103 so that patterned negative photoresist 104 remains between respective positive photoresists 103. Accordingly, a photoresist is provided including negative photoresists 103 and positive photoresist 104.

Negative photoresist 103 can be composed of a mixture of cured rubber-based resin and a bis-diazide-based compound in an organic solvent. The latter has photosensitivity and acts as a crosslink. In negative photoresist 103, a pattern can be formed since a light irradiating portion is formed in a mesh structure by way of the crosslink so that it is cured and also the solubility difference for development between the light irradiating portion and the light non-irradiating portion.

Positive photoresist 104 can be composed of a mixture of quinone-diazide-based photosensitizer, alkali-soluble phenol-based resin, and organic solvent to obtain an insoluble mixture that can be alkali-soluble using a light irradiation process. In positive photoresist 104, since the light irradiating portion can be solved using a developing solution (alkali-based) and a non-exposed portion is insoluble, a pattern can be formed using the solubility difference as in negative photoresist 103.

Figure 2C:
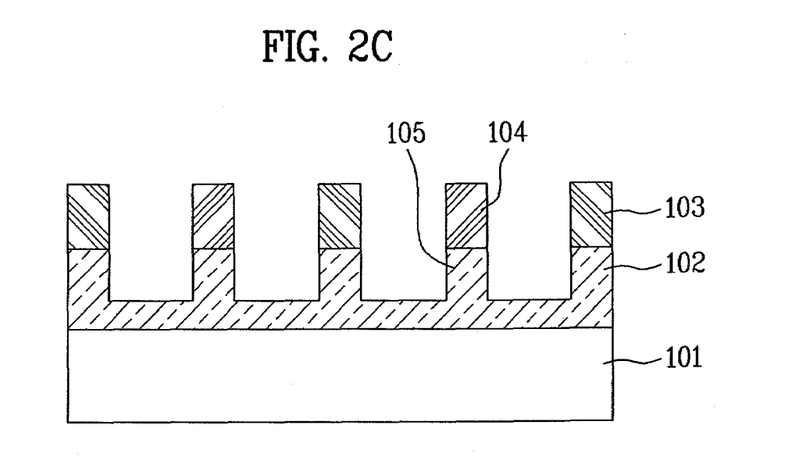

As illustrated in example FIG. 2C, a plurality of first conductive lines 105 protruded with a predetermined width can be formed by selectively etching conductive layer 102 by a reactive ion etching (RIE) process or a deep reactive ion etching (DRIE) process using patterned positive photo resist 103 and negative photo resist 104 as masks. The etching process conditions of conductive layer 102 can be as follows: injection of $CF_4$ of 50 sccm, pressure of 4 mTorr, RF power source of 500 W, bias power of 40 W, and a time of 10 seconds. After formation of first conductive lines 105, positive photo resists 103 and negative photo resists 104 can then be removed.

Figure 2D:
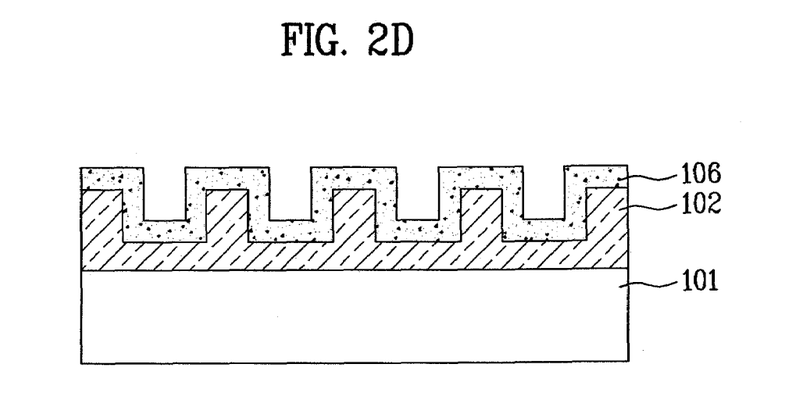

As illustrated in example FIG. 2D, oxide film 106 can be formed on and/or over semiconductor substrate 101 including first conductive lines 105. Oxide film 106 having a thickness of between approximately 3000 Å±300 Å can be formed on and/or over semiconductor substrate 101 by performing a wet oxidation process using a furnace equipment under the following process conditions: time of between thirty to ninety minutes at a temperature of 600° C. to 1200° C., pressure of normal pressure, and injecting $H_2$ gas of 6 to 12 slm, $O_2$ gas of 3.5 to 11 slm, and HCL gas of 0.3 to 0.9 slm. Alternatively, oxide film 106 can be formed under the following process conditions: a time of sixty minutes, a temperature of 800° C., a pressure of normal pressure and injecting $H_2$ gas of 9 slm, $O_2$ gas of 7.5 slm and HCL gas of 0.6 slm.

Figure 2E:
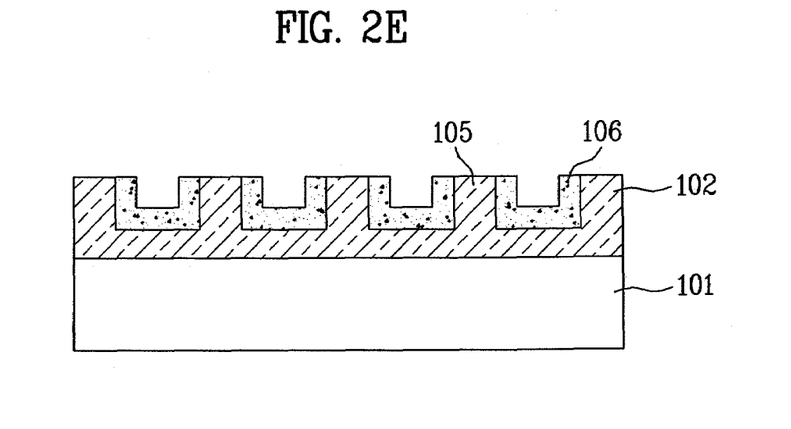

As illustrated in example FIG. 2E, a chemical mechanical polish (CMP) process can be performed over the overall surface of oxide film 106 using the uppermost surface of first conductive line 105 as a target so that oxide film 106 remains only between respective first conductive lines 105.

Figure 2F:
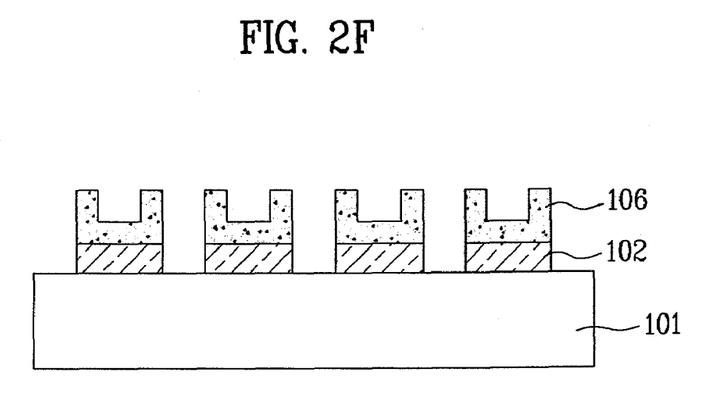

As illustrated in example FIG. 2F, first conductive lines 105 can be removed by an etching process using oxide film 106 as a mask. The etching of first conductive lines 105 can be performed for ten seconds or less through a front end processor (FEP) deep. Accordingly, oxide film 106 remains on and/or over conductive layer 102.

Figure 2G:
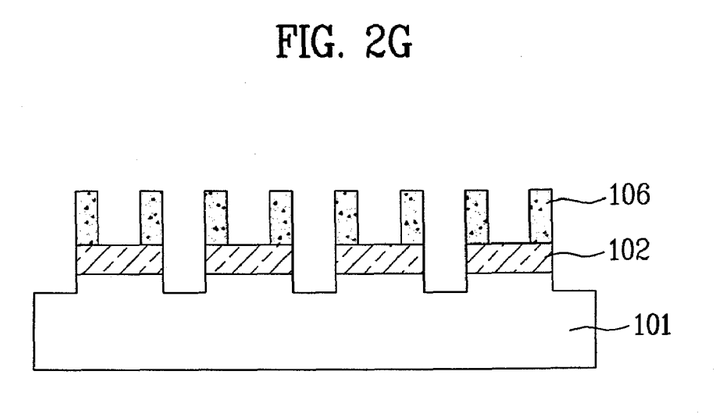

As illustrated in example FIG. 2G, a portion of oxide film 106 can be removed by etching the uppermost of a dense line of oxide film 106 through a RIE process. When removing the dense line of oxide film 106, a portion of the surface of semiconductor substrate 101 can be removed to form a plurality of trenches in semiconductor substrate 101 having a predetermined thickness. The selective etching conditions of oxide film 106 can be as follows: gap of 27 mm, pressure of 55 mTorr, RF power of 600 W, and injecting $CHF_3$ of 50 sccm and $O_2$ of 20 sccm at a time of between 18 to 28 seconds.

Figure 2H:
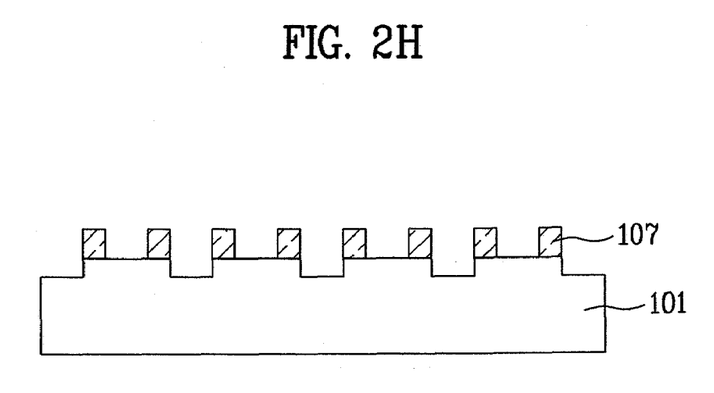

As illustrated in example FIG. 2H, a plurality of second conductive lines 107 can be formed by selectively removing conductive layer 102 using remaining oxide film 106 as a mask. The etching process conditions of conductive layer 102 can be as follows: injecting $CF_4$ of 50 sccm, pressure of 4 mTorr, RF power source of 500 W, bias power of 40 W, and a time of 10 seconds. Thereafter, oxide film 106 can be removed, resulting in a patterned semiconductor device.

Figure 3A:
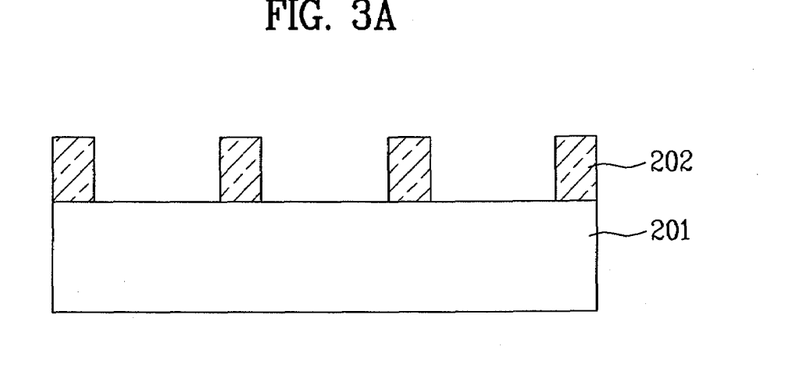

As illustrated in example FIG. 3A, in accordance with embodiments, a method of patterning a semiconductor device can include an anti-reflective layer having a thickness of between 250 Å to 300 Å formed on and/or over etch material 201 such as an insulation layer or a conductive layer. A plurality of positive photoresists 202 having a thickness of between 2000 Å to 3000 Å can then be coated on and/or over the anti-reflective layer and then patterned to have a dense line of 100 nm or less. Negative photoresists 202 can be patterned through exposure and development processes utilizing ArF equipment.

Figure 3B:
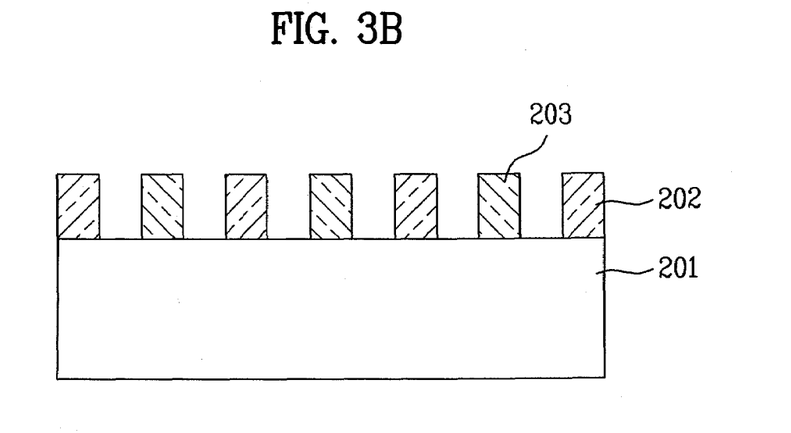

As illustrated in example FIG. 3B, after patterning negative photoresists 203, a patterning process can be performed by exposing and developing negative photoresists 203 using the same mask used when exposing positive photoresists 202 to form negative photoresists 203 between positive photoresists 202. The characteristics of the negative photo resist and the positive photo resist are the same as described above.

Figure 3C:
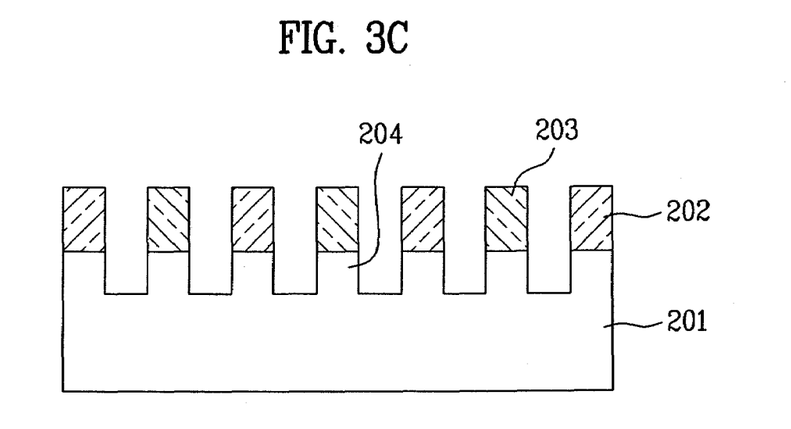

As illustrated in example FIG. 3C, a plurality of first etch material lines 204 can be patterned by selectively etching etch material 201 through a RIE process or a DRIE process using patterned positive photo resist 202 and negative photo resist as masks. The etching process conditions of etch material 201 can be $CF_4$ of 50 sccm, at a pressure of 4 mTorr, RF power source of 500 W, bias power of 40 W, and a time of 10 seconds. After patterning first etch material lines 204, positive photo resists 202 and negative photo resists 203 can be removed.

Figure 3D:
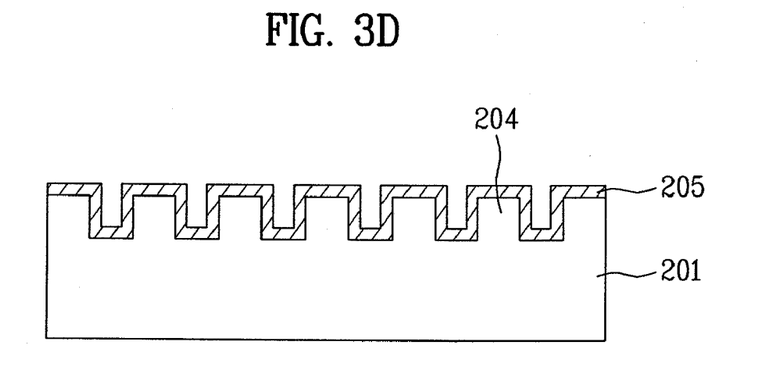

As illustrated in example FIG. 3D, oxide film 205 can be formed on and/or over etch material 201 including first etch material lines 204. Oxide film 205 having a thickness of 3000 Å±300 Å, can be formed by performing a wet oxidation process using a furnace equipment under process conditions of a time of thirty to ninety minutes at a temperature of between 600° C. to 1200° C., a pressure of normal pressure, using $H_2$ gas of 6 to 12 slm, $O_2$ gas of 3.5 to 11 slm, and HCL gas of 0.3 to 0.9 slm. Preferably, oxide film 205 can be formed for sixty minutes, at a temperature of 800° C. and a pressure of normal pressure, using $H_2$ gas of 9 slm, $O_2$ gas of 7.5 slm and HCL gas of 0.6 slm.

Figure 3E:
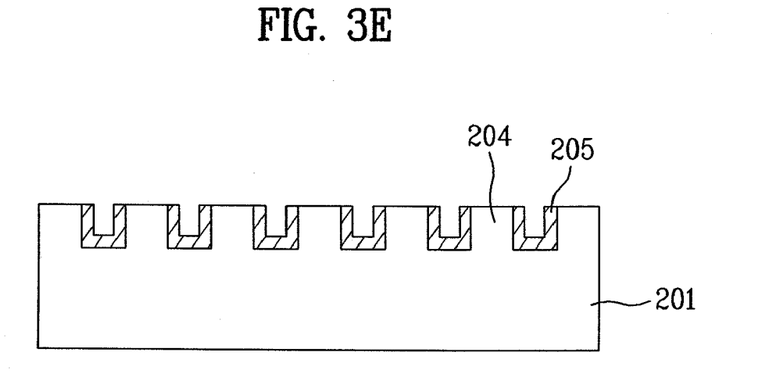

As illustrated in example FIG. 3E, a CMP process can be performed over the overall surface of oxide film 205 using the uppermost surface of first etch material line 204 as a target so that oxide film 205 remains only between first etch material lines 204.

Figure 3F:
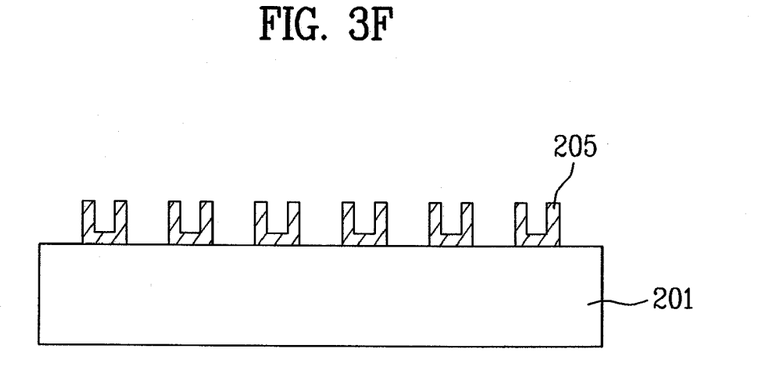

As illustrated in example FIG. 3F, first etch material lines 204 can be removed using oxide film 205 remaining between first etch material lines 204 as a mask. The etching of first etch material lines 204 can be performed for ten seconds or less through a front end processor (FEP) deep. Accordingly, oxide film 205 can be provided directly in contact with and on and/or over etch material 201.

Figure 3G:
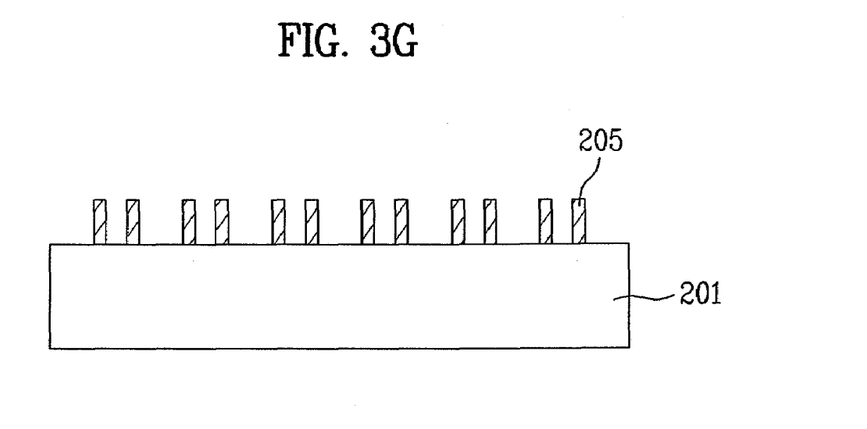

As illustrated in example FIG. 3G, a portion of oxide film 205 can then be removed by etching the upper of a dense line using a RIE process under conditions of a gap of 27 mm, pressure of 55 mTorr, RF power of 600 W, $CHF_3$ of 50 sccm, $O_2$ of 20 sccm, and a time of between 18 to 28 seconds.

Figure 3H:
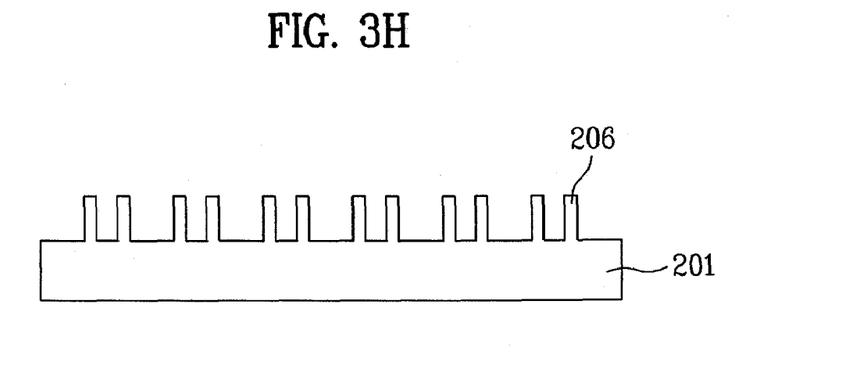

As illustrated in example FIG. 3H, second etch material lines 206 can be formed by selectively removing portions of etch material 201 using the remaining oxide film 205 as a mask. The etching process conditions of etch material 201 can be $CF_4$ of 50 sccm, pressure of 4 mTorr, RF power source of 500 W, bias power of 40 W, and a time of 10 seconds. After the etching process, oxide film 205 can then be removed.

Figure 4A:
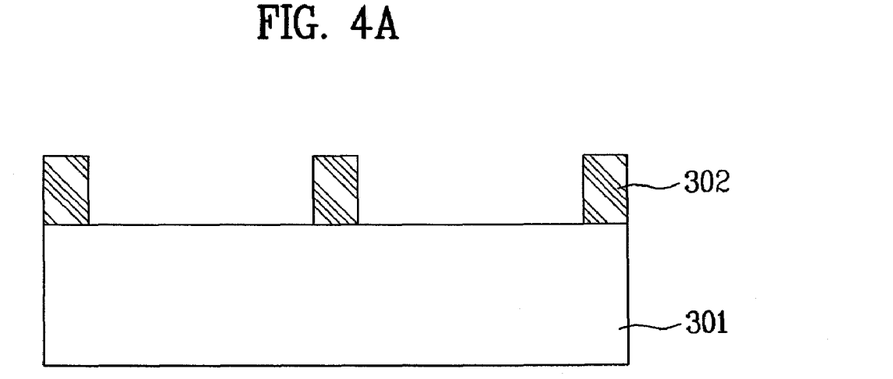

As illustrated in example FIG. 4A, in accordance with embodiments, a method of patterning a semiconductor device can include etch material layer 301 such as an insulation layer or a conductive layer, formed on and/or over a semiconductor substrate. An anti-reflective layer can be formed at a thickness of between approximately 250 Å to 300 Å on and/or over etch material layer 301. Positive photoresists 302 can be coated at a thickness of between approximately 2000 Å to 3000 Å on and/or over the anti-reflective layer and then patterned to have a dense line of 100 nm or less through exposure and development processes utilizing an ArF equipment.

Figure 4B:
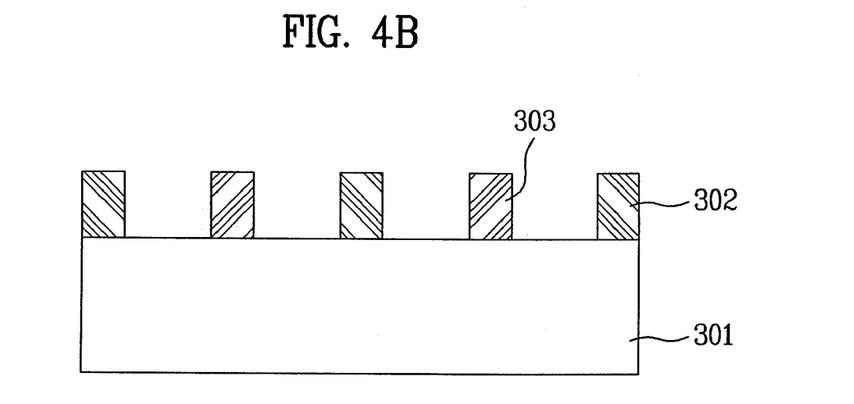

As illustrated in example FIG. 4B, negative photoresists 303 can be coated on and/or over etch material layer 301 including patterned positive photoresists 302. Negative photoresists 303 can then be patterned by exposing and developing negative photoresists 303 using the same mask as the mask used when exposing positive photoresists 302 so that patterned negative photo resists 303 remain between positive photoresists 302. The characteristics of the negative photo resist and the positive photo resist are the same as described above.

Figure 4C:
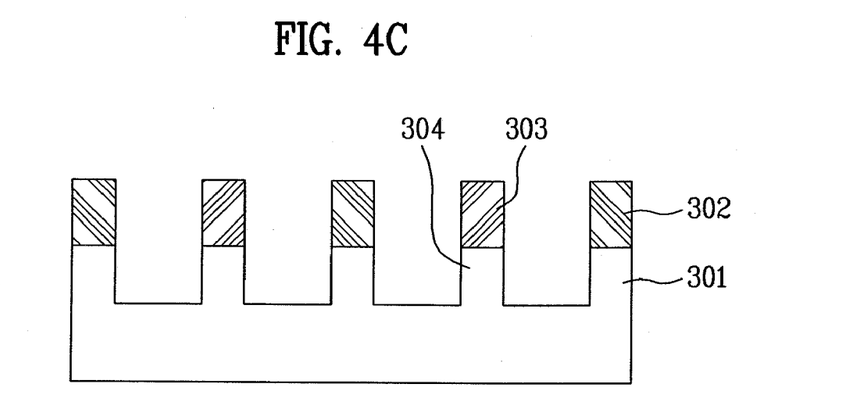

As illustrated in example FIG. 4C, a plurality of first etch material lines 304 can be patterned by selectively etching etch material layer 301 through a RIE process or a DRIE process using patterned positive photoresists 302 and patterned negative photoresists 303 as masks. The etching process conditions of etch material layer 301 can be as follows: using $CF_4$ of 50 sccm, pressure of 4 mTorr, RF power source of 500 W, bias power of 40 W, and a time of 10 seconds. After forming first etch material lines 304, patterned positive photoresists 302 and patterned negative photoresists 303 can then be removed.

Figure 4D:
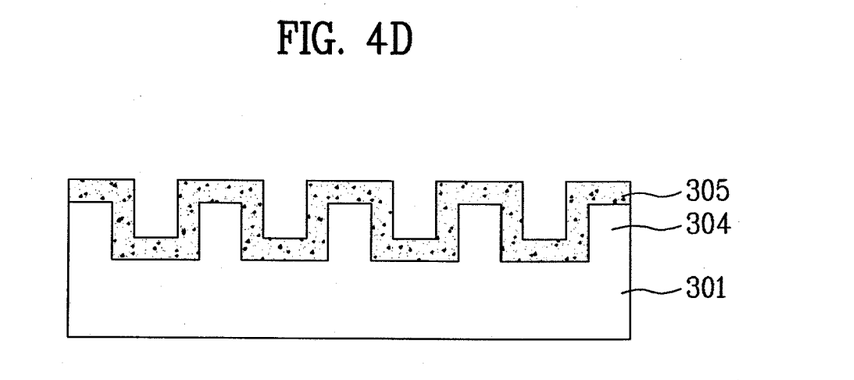

As illustrated in example FIG. 4D, oxide film 305 having a thickness of 3000 Å±300 Å can be formed on and/or over etch material 301 including first etch material lines 304. Oxide film 305 can be formed by performing a wet oxidation process using a furnace equipment under the following process conditions: a time of thirty to ninety minutes at a temperature of 600° C. to 1200° C., pressure of normal pressure, using $H_2$ gas of 6 to 12 slm, $O_2$ gas of 3.5 to 11 slm, and HCL gas of 0.3 to 0.9 slm. Preferably, oxide film 305 can be formed for sixty minutes, at a temperature of 800° C. and a pressure of normal pressure, using $H_2$ gas of 9 slm, $O_2$ gas of 7.5 slm and HCL gas of 0.6 slm.

Figure 4E:
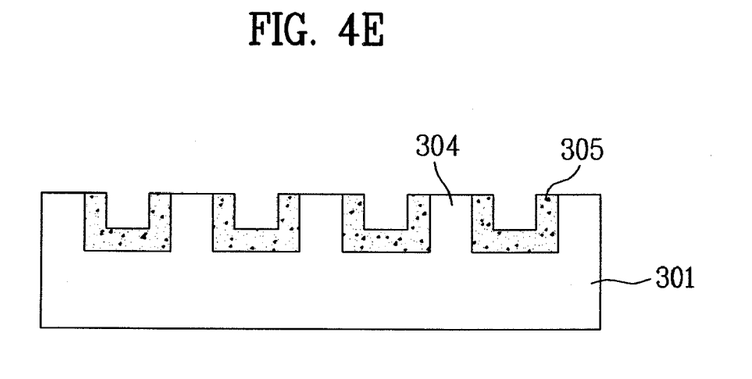

As illustrated in example FIG. 4E, a CMP process can be performed on and/or over oxide film 305 using the uppermost surface of first etch material line 304 as a target so that oxide film 305 remains only in trenches between respective first etch material lines 304.

Figure 4F:
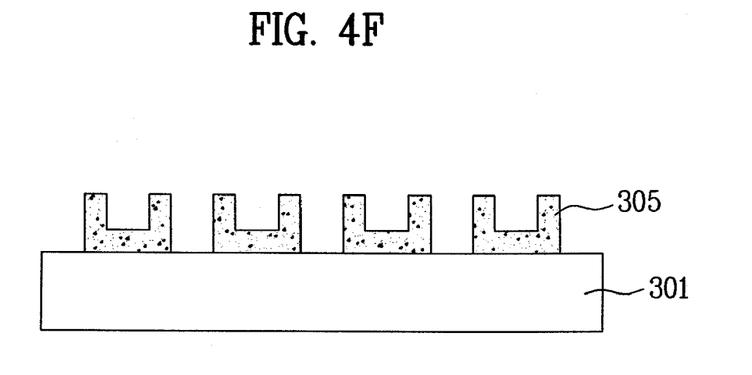

As illustrated in example FIG. 4F, first etch material lines 304 can then be removed using the remaining oxide film 305 as a mask. Accordingly, oxide film 305 having a pair of vertically extending lines connected by a dense lateral line can be provided in direct contact with the uppermost surface of etch material layer 301. The etching of first etch material line 304 lines can be performed for ten seconds or less using a front end processor (FEP) deep.

Figure 4G:
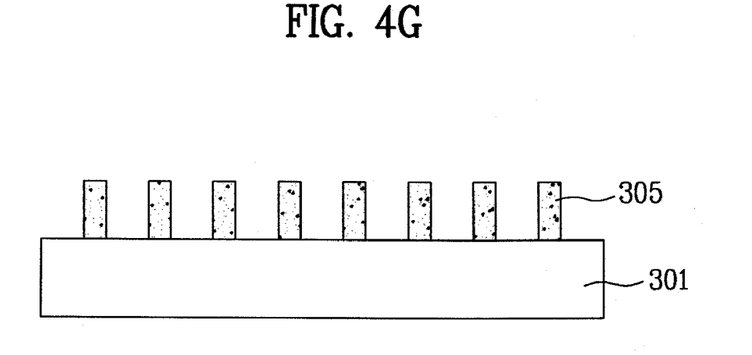

As illustrated in example FIG. 4G, a portion of oxide film 305 can be removed by etching the dense lateral line using an RIE process, thus leaving the vertical lines of oxide layer 305. At this time, the selective etching conditions of oxide film 305 can be a gap of 27 nm, pressure of 55 mTorr, RF power of 600 W, $CHF_3$ of 50 sccm, $O_2$ of 20 sccm, and a time of between 18 to 28 seconds.

Figure 4H:
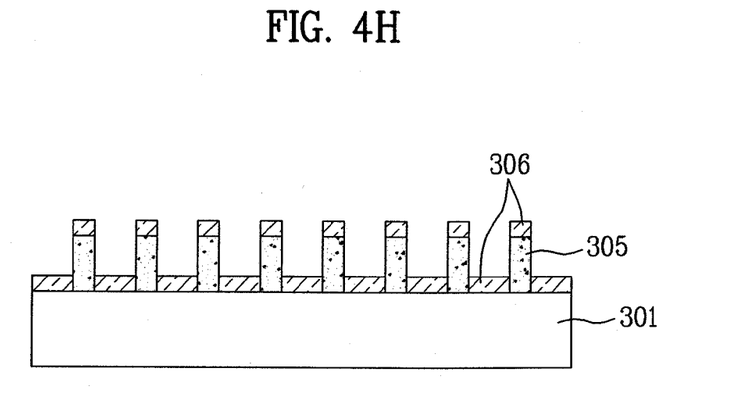

As illustrated in example FIG. 4H, metal layer 306 can be deposited by performing a metal e-beam deposition on and/or over etch material layer 301 including vertically extending lines of oxide film 305. Metal layer 306 can be composed of any one of Ti, TiN, Al and Cu.

Figure 4I:
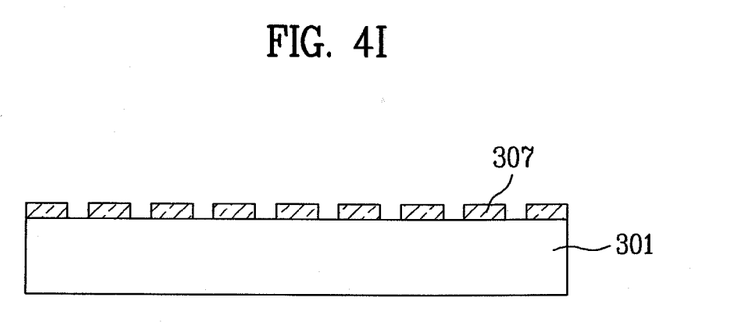

As illustrated in example FIG. 4I, a plurality metal lines 307 can be formed on and/or over etch material layer 301 in a spaced apart manner. Metal lines 307 can be formed by removing oxide film 305 and the portion of metal layer 306 provided on and/or over the uppermost surface of oxide film 305.

In accordance with embodiments, a semiconductor device can be formed having minimum line width capable of being implemented in a photolithographic process. A fine pattern can be implemented by patterning a positive photoresist on and/or over a conductive layer to a size smaller on the order of ⅔ than a mask size using high dosage and patterning a negative photoresist to a size smaller on the order of ⅔ than the mask by using the same mask, thereby making it possible to form a smaller spacer.

The patterning of the conductive layer can be performed through a RIE process, the oxide film can be formed through an oxidation process, an oxide film mask having a half line width of the line width of a photo process through the CMP process and the FEP deep process can be formed and etched. Accordingly, it can be possible to implement the line width of several nm in magnitude, which heretofore has been difficult to implement.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A method comprising:

forming a conductive layer over a semiconductor substrate;

alternatively forming positive photoresists and negative photoresists over the conductive layer;

forming a plurality of first conductive lines by selectively removing a portion of the conductive layer using the positive photoresist and the negative photoresist as masks;

forming an oxide film over the semiconductor substrate including the first conductive lines and the conductive layer;

performing a planarization process over the oxide film using the uppermost surface of the first conductive line as a target;

removing the plurality of first conductive lines using the oxide film as a mask;

forming a plurality of trenches in the semiconductor substrate and removing a portion of the oxide film to expose the uppermost surface of the conductive layer; and then forming a plurality of second conductive lines by removing the exposed conductive layer using the oxide film as a mask.

2. The method of claim 1, wherein the conductive layer is formed using low pressure chemical vapor deposition at a temperature of between approximately 600° C. to 615° C., a pressure of 0.4 Torr, and injecting $SiH_4$ gas in an amount of 2 slm for a time of twenty minutes.

3. The method of claim 1, wherein the positive photoresist and the negative photoresist are exposed and developed using the same mask.

4. The method of claim 1, wherein the positive photoresists and the negative photoresists are formed spaced apart at predetermined intervals.

5. The method of claim 1, wherein the oxide film is formed having a thickness of approximately 3000 Å±300 Å by performing a wet oxidation process in a furnace equipment.

6. The method of claim 5, wherein the wet oxidation process is performed for thirty to ninety minutes at a temperature of between approximately 600° C. to 1200° C., a pressure of normal pressure, using $H_2$ gas of 6 to 12 slm, $O_2$ gas of 3.5 to 11 slm, and HCL gas of 0.3 to 0.9 slm.

* * * * *